United States Patent
Qiu et al.

(10) Patent No.: US 12,144,096 B2
(45) Date of Patent: Nov. 12, 2024

(54) METHOD FOR MEASURING ELECTRON NONEXTENSIVE PARAMETER OF PLASMA USING NONEXTENSIVE STATISTICAL MECHANICS

(71) Applicant: NANCHANG UNIVERSITY, Nanchang (CN)

(72) Inventors: Huibin Qiu, Nanchang (CN); Donghua Xiao, Nanchang (CN); Xingkun Peng, Nanchang (CN); Yuqing Zhu, Nanchang (CN); Xianyang Zhang, Nanchang (CN); Youlong Yuan, Nanchang (CN); Qilong Cai, Nanchang (CN); Tianyi Hu, Nanchang (CN); Yue Gao, Nanchang (CN); Zhiyi Ming, Nanchang (CN); Jinmao Zhou, Nanchang (CN); Zhenyu Zhou, Nanchang (CN); Sanqiu Liu, Nanchang (CN)

(73) Assignee: NANCHANG UNIVERSITY, Nanchang (CN)

( * ) Notice: Subject to any disclaimer, the term of this patent is extended or adjusted under 35 U.S.C. 154(b) by 409 days.

(21) Appl. No.: 17/554,405

(22) Filed: Dec. 17, 2021

(65) Prior Publication Data
US 2022/0110206 A1    Apr. 7, 2022

Related U.S. Application Data

(63) Continuation of application No. PCT/CN2020/084082, filed on Apr. 10, 2020.

(30) Foreign Application Priority Data

Oct. 18, 2019 (CN) .......................... 201910985875.4

(51) Int. Cl.
*H05H 1/00* (2006.01)
*H01J 37/32* (2006.01)

(52) U.S. Cl.
CPC ..... *H05H 1/0081* (2013.01); *H01J 37/32926* (2013.01)

(58) Field of Classification Search
CPC .......... H01J 37/32926; H01J 37/32192; H01J 37/32431; H01J 37/32229;
(Continued)

(56) References Cited

U.S. PATENT DOCUMENTS 6,902,646 B2 * 6/2005 Mahoney .......... H01J 37/32935
118/712
7,476,556 B2 * 1/2009 Qin .................... H01J 37/32935
257/E21.143

(Continued)

FOREIGN PATENT DOCUMENTS

CN         102650663 A  *  8/2012

*Primary Examiner* — Vinh P Nguyen
(74) *Attorney, Agent, or Firm* — Birchwood IP

(57) ABSTRACT

A method for measuring an electron nonextensive parameter of a plasma by using nonextensive statistical mechanics and electric probe is provided. The plasma is described by the nonextensive statistical mechanics and establishes a nonextensive single electric probe theory on the basis of this. The electron nonextensive parameter have been measured which cannot be measured by traditional single probe, and obtained more accurate electron temperature, plasma potential, electron density and floating potential than traditional single probe. The nonextensive electric probe plays a role in plasma diagnosis, which will measure the nonextensivity of plasma and improve the diagnostic accuracy of other plasma parameters.

4 Claims, 4 Drawing Sheets

(58) Field of Classification Search
CPC ....... H01J 2237/24485; H01J 37/32422; H01J 37/32917; H01J 37/32935; H01J 49/488; H05H 1/0081; H05H 1/4622; H05H 1/0006

See application file for complete search history.

(56) References Cited

U.S. PATENT DOCUMENTS

| | | | |
|---|---|---|---|
| 7,875,859 B2* | 1/2011 | Chen .................... | H01J 49/443 |
| | | | 250/397 |
| 8,660,805 B2* | 2/2014 | Bravenec .......... | H01J 37/32954 |
| | | | 702/57 |
| 11,569,066 B2* | 1/2023 | Cubaynes ............... | H02M 7/49 |
| 11,856,682 B2* | 12/2023 | Qiu ...................... | H05H 1/0081 |

* cited by examiner

METHOD FOR MEASURING ELECTRON NONEXTENSIVE PARAMETER OF PLASMA USING NONEXTENSIVE STATISTICAL MECHANICS

TECHNICAL FIELD

The disclosure relates to the field of plasma nonextensive parameters diagnosis, and more particularly to a method for measuring plasma electron nonextensive parameter.

BACKGROUND

Plasma exists widely in the universe and is often regarded as the fourth state of matter apart from solid, liquid and gas. When the solid is heated to the melting point, the average kinetic energy of the particles exceeds the binding energy of the lattice, and the solid becomes liquid. When a liquid is heated to the boiling point, the kinetic energy of the ions exceeds the binding energy between the particles, and the liquid becomes a gas. If a gas is heated further, it is partially or completely ionized, that is, the electrons in its outer layer break away from the nucleus and become free electrons, and the atoms that have lost their outer electrons become charged ions. When the ratio of charged particles exceeds a certain degree, ionized gas will show obvious electromagnetic properties, and the number of positive and negative ions (electrons) is equal, which is called plasma.

In the field of plasma parameter diagnosis, many plasma parameters (information) are obtained by electric probe diagnosis. The preset distribution of the components (particles) in the plasma is very important for single probe measurement, so it is necessary to preset what statistical mechanics can be used to describe the plasma to be measured. The statistical hypothesis of plasma includes Boltzmann-Gibbs statistical mechanics, in which the components of plasma obey the Maxwellian distribution. However, theoretical analysis and a large number of experiments show that the components of plasma do not satisfy Boltzmann-Gibbs statistics and can be well described by nonextensive statistical mechanics, while the new plasma parameters, electron nonextensive parameters ($q_{F_e}$), which are introduced to describe the nonextensive properties of plasma, cannot be diagnosed yet.

SUMMARY

The disclosure provides a method for measuring plasma electron nonextensive parameters in view of the above technical problem that the nonextensive parameters of plasma cannot be measured.

The technical solution adopted by the disclosure is as follows:

Specifically, a method for measuring an electron nonextensive parameter of a plasma is presented. Nonextensive statistical mechanics and electric probe are used to measure the nonextensive parameter of the plasma.

In an embodiment, using the nonextensive statistical mechanics and the nonextensive single electric probe to measure the electron nonextensive parameters of the plasma may include the following specific steps:

step 1, describing the plasma with the nonextensive statistical mechanics to obtain a formula of I-V curve of the nonextensive single electric probe; step 2, collecting I-V experimental data of the nonextensive single electric probe; step 3, performing nonlinear fitting on the I-V experimental data collected in the step 2 by using the formula of I-V curve of the nonextensive single electric probe obtained in the step 1, thereby obtaining a data set; step 4, drawing a SSE-$q_{F_e}$ curve using a sum of square due to error (SSE) as a goodness of fit measure; step 5, obtaining a value of the electron nonextensive parameter corresponding to a minimum value of the SSE according to the SSE-$q_{F_e}$ curve; step 6, drawing a $R^2$-$q_{F_e}$ curve using a nonlinear fitting coefficient of determination $R^2$ as a goodness of fit measure; step 7, obtaining a value of the electron nonextensive parameter corresponding to a maximum value of the $R^2$ according to the $R^2$-$q_{F_e}$ curve; step 8, comparing the values of the electron nonextensive parameter respectively corresponding to the minimum value of the SSE obtained in the step 5 and the maximum value of the $R^2$ obtained in the step 7; step 9, determining whether the values of the electron nonextensive parameter compared in the step 8 are consistent; step 10, if the result of step 9 is consistent, it is confirmed as the optimal electron nonextensive parameter; step 11, substituting the optimal value of the electron nonextensive parameters obtained in the step 10 into the data set in the step 3 to obtain a target data set corresponding to the optimal value of the electron nonextensive parameter; step 12, outputting a measurement result report.

In an embodiment, a formula of collection current of the nonextensive single electric probe in the step 1 is:

$$I = en_e A_p \left(\frac{\kappa_B T_e}{m_i}\right)^{1/2} \left[\frac{A_q}{q_{F_e}}\sqrt{\frac{m_i}{2\pi m_e}}\left[1+(q_{F_e}-1)\frac{e(V-\Phi_p)}{\kappa_B T_e}\right]^{\frac{1}{q_{F_e}-1}+\frac{1}{2}} - \left[1-(q_{F_e}-1)\frac{1}{2}\right]^{\frac{1}{q_{F_e}-1}+\frac{1}{2}}\right]$$

where V is a bias voltage, $\Phi_p$ is a plasma potential, $\kappa_B$ is the Boltzmann constant, e is the electron charge, $T_e$ is an electron temperature, $n_e$ is an electron density in the undisturbed area, $A_p$ is the probe area, $A_q$ is the normalization constant of nonextensive distribution, $q_{F_e}$ is the electron nonextensive parameter, $m_i$ is an ion mass, and $m_e$ is the electron mass.

In the disclosure, plasma is described by the nonextensive statistical mechanics, and a nonextensive single electric probe theory is established on this basis. Using the nonextensive single electric probe, we measured the electron nonextensive parameter that cannot be measured by the traditional single electric probe, and obtained more accurate electron temperature, plasma potential, electron density and floating potential than the traditional single probe. Through the technical solution of the disclosure, the nonextensive electric probe plays a role in plasma diagnosis, which will measure the plasma nonextensivity and improve the diagnostic accuracy of other plasma parameters.

DETAILED DESCRIPTION OF EMBODIMENTS

Figure 1:
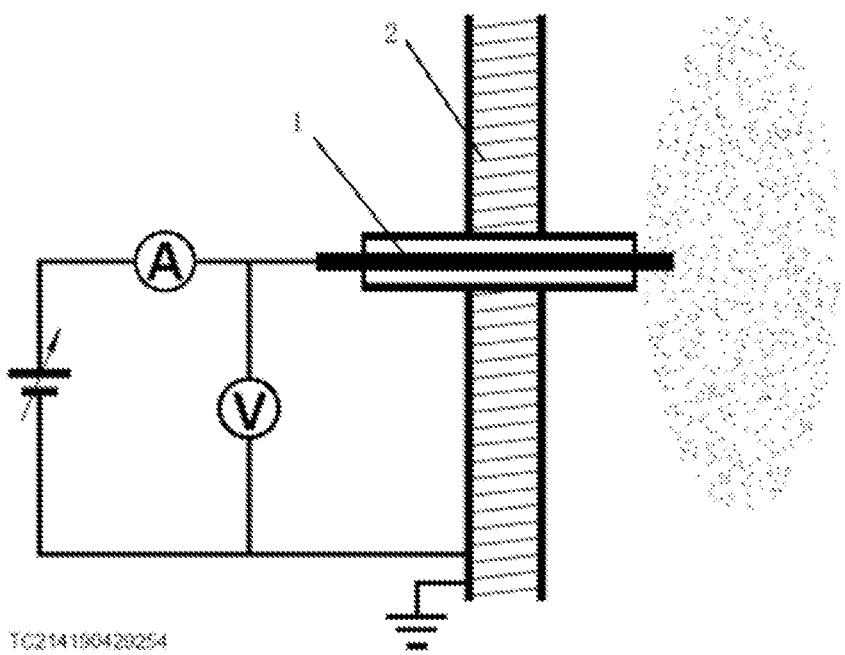
FIG. 1 is a schematic diagram of a single electric probe device; 1-single electric probe, 2-vacuum chamber wall.

The disclosure is described in detail below in conjunction with the attached drawings.

A method for measuring an electron nonextensive parameter of a plasma is presented. Nonextensive statistical mechanics and electric probe are used to measure the nonextensive parameter of the plasma.

Specific steps are as follows.

step 1, describing the plasma with the nonextensive statistical mechanics, to obtain a formula of I-V curve of the nonextensive single electric probe; step 2, collecting I-V experimental data of the nonextensive single electric probe; step 3, performing nonlinear fitting on the nonextensive I-V experimental data collected in the step 2 by using the I-V curve of the nonextensive single electric probe obtained in the step 1, thereby obtaining a data set; step 4, drawing a SSE-$q_e$ curve using a sum of square due to error (SSE) as a goodness of fit measure; step 5, obtaining a value of the electron nonextensive parameter corresponding to a minimum value of the SSE according to the SSE-$q_e$ curve; step 6, drawing a $R^2$-$q_{F_e}$ curve using a nonlinear fitting coefficient of determination $R^2$ as a goodness of fit measure; step 7, obtaining a value of the electron nonextensive parameter corresponding to a maximum value of the $R^2$ according to the $R^2$-$q_{F_e}$ curve; step 8, comparing the values of the electron nonextensive parameter respectively corresponding to the minimum value of the SSE obtained in the step 5 and the maximum value of the $R^2$ obtained in the step 7; step 9, determining whether the values of the electron nonextensive parameter compared in the step 8 are consistent; step 10, confirming any one of the values of the electron nonextensive parameter as an optimal value of the electron nonextensive parameter when the values of the electron nonextensive parameter are determined to be consistent; step 11, substituting the optimal value of the electron nonextensive parameter obtained in the step 10 into the data set in the step 3 to obtain a target data set corresponding to the optimal value of the electron nonextensive parameter; step 12, outputting a measurement result report.

The curve formula of the nonextensive single electric probe in the step 1 is derived through the following process:
when a probe potential is less than a potential at ion sheath edge, namely $V<\Phi_p-(\kappa_B T_e/2e)$, a sheath of positive charges will form around the probe. Current collected by probe is the current formed by the random thermal movement of charged particles entering the sheath. Under the framework of nonextensive statistics, the electron current $I_e$ is random thermal motion current multiplied by the nonextensive exponential factor (replace the of Boltzmann factor):

$$I_e = \frac{1}{4}en_e A_p \bar{v}_{q_{F_e}}\left[1+(q_{F_e}-1)\frac{e(V-\Phi_p)}{\kappa_B T_e}\right]^{\frac{1}{q_{F_e}-1}+\frac{1}{2}} \quad (1)$$

where V is bias voltage, $\Phi_p$ is plasma potential, $\kappa_B$ is Boltzmann constant, e is electron charge, $T_e$ is electron temperature, $n_e$ is electron density in undisturbed region, $A_p$, is probe area, $A_q$ is normalization constant of nonextensive distribution, $q_{F_e}$ is nonextensive parameter in electron distribution function of plasma, $$\bar{v}_{q_{F_e}} = (A_q/q_{F_e})\sqrt{8\kappa_B T_e/\pi m_e}$$

is average thermal velocity of electron in nonextensive plasma. For collection of ion, according to Bohm's sheath formation theory, there is a presheath area outside the sheath, and ions flowing to the probe accelerate from undisturbed plasma region through the presheath region and reach the ion sound velocity $c_s(=\sqrt{\kappa_B T_e/m_i})$ at the edge of the sheath. What the probe surface collects is a current of ions across the edge of a sheath, called ion saturation current $I_{si}(=-|I_{si}|)$. Extending Bohm's sheath formation theory to nonextensive case, one has $$|I_{si}| = eA_s n_e\left[1-(q_{F_e}-1)\frac{1}{2}\right]^{\frac{1}{q_{F_e}-1}+\frac{1}{2}}\left(\frac{\kappa_B T_e}{m_i}\right)^{1/2} \quad (2)$$

where $A_s$ is the sheath area and $A_s \approx A_p$ when the shell thickness is negligible. Therefore, at this time, the total current collected by probe is $$I = en_e A_p\left(\frac{\kappa_B T_e}{m_i}\right)^{1/2}\left[\frac{A_q}{q_{F_e}}\sqrt{\frac{m_i}{2\pi m_e}}\left[1+(q_{F_e}-1)\frac{e(V-\Phi_p)}{\kappa_B T_e}\right]^{\frac{1}{q_{F_e}-1}+\frac{1}{2}} - \right.$$
$$\left. \left[1-(q_{F_e}-1)\frac{1}{2}\right]^{\frac{1}{q_{F_e}-1}+\frac{1}{2}}\right] \quad (3)$$

where $m_i$ is ion mass, $m_e$ is electron mass.

In the step 2, the I-V experimental data are collected through the commonly used single probe device, as shown in FIG. 1. The single probe device includes the single probe 1 and the vacuum chamber wall 2. The surface of the single probe is wrapped by a slightly short ceramic, quartz or glass insulating tube. The right end of the probe passes through the vacuum chamber wall and directly contacts the plasma represented by random scatter points in FIG. 1. The disclosure collects I-V experimental data by a single probe. The left end of the probe is connected with the probe circuit, and the variable power supply with the positive pole upward is connected with the ammeter, which measures current collected by the probe (the positive direction of the current is set as the direction of flow from the probe surface to the plasma; it can be seen from the direction of charge movement of the electron current and ion current that the electron current is in the positive direction and the ion current is in the negative direction). A voltmeter connected to the grounded vacuum chamber wall measures a variable bias voltage applied to a single probe. By adjusting the bias voltage of the power supply, the current data collected by the probe under different bias voltage can be obtained.

Figure 2:
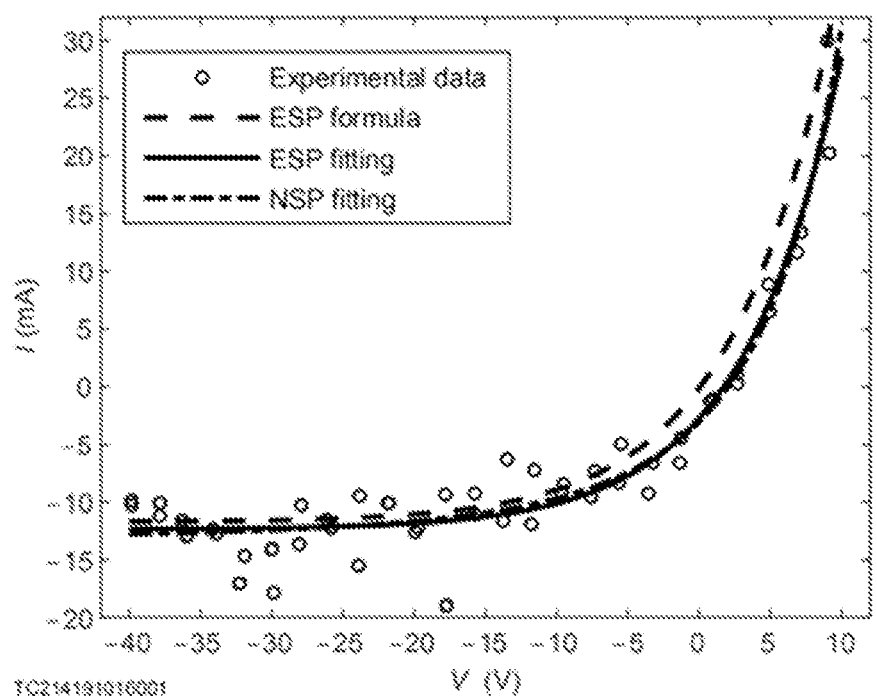
FIG. 2 is a graph of the single electric probe (I-V) experimental data according to three processing methods (ESP formula, ESP fitting, NSP fitting); the abscissa is the bias voltage V applied to the single probe, and the ordinate is the probe current I; where the ESP formula line is the intuitive curve corresponding to the results measured by the formula method of traditional single electric probe; the ESP fitting line is an intuitive curve corresponding to the measurement results obtained by nonlinear fitting under the assumption that the plasma components meet Maxwellian (extensive) distribution; and the NSP fitting line is an intuitive curve corresponding to the measurement results obtained by nonlinear fitting under the assumption that the plasma components meet the nonextensive distribution.

As shown in FIG. 2, it is a comprehensive effect diagram obtained by processing the single probe I-V experimental data collected in the step 2 according to three methods (ESP formula, ESP fitting, and NSP fitting). The abscissa is the external changing bias voltage with range of [−39.8582, 9.1489] V applied to the single probe; actually, the minimum voltage in the experimental data is −39.8582 V, which determines the maximum value of the allowable electron nonextensive parameter 1.164, and the maximum voltage 9.1489 V ($\approx \Phi_s$) is obtained by the method of "semilog-knee". The ordinate is total current I collected by single probe with range of [−18.98, 29.97] mA. The dots are the I-V experimental data used in the disclosure. All data satisfying $V \leq \Phi_s$ are selected, and a total of 50 data points are selected. Other data are not the processing objects of the theory proposed by the disclosure. The ESP formula line is an intuitive curve corresponding to the results measured by method of the ESP formula, the ESP fitting line is the intuitive curve corresponding to the single probe measurement results obtained by method of ESP fitting, and the NSP fitting line is the intuitive curve corresponding to the single probe measurement results obtained by method of NSP fitting. The three curves conform to the trend of the single probe measurement curve and always increase with the increase of the bias voltage when $V \leq \Phi_s$. It is easy to read from the figure that the ESP formula line; namely the result measured by the ESP formula method is the worst result of closing to the experimental data. We use the sum of squares due to error SSE and the coefficient of determination $R^2$ to determine which is the closest to the experimental data among the three curves.

Figure 3:
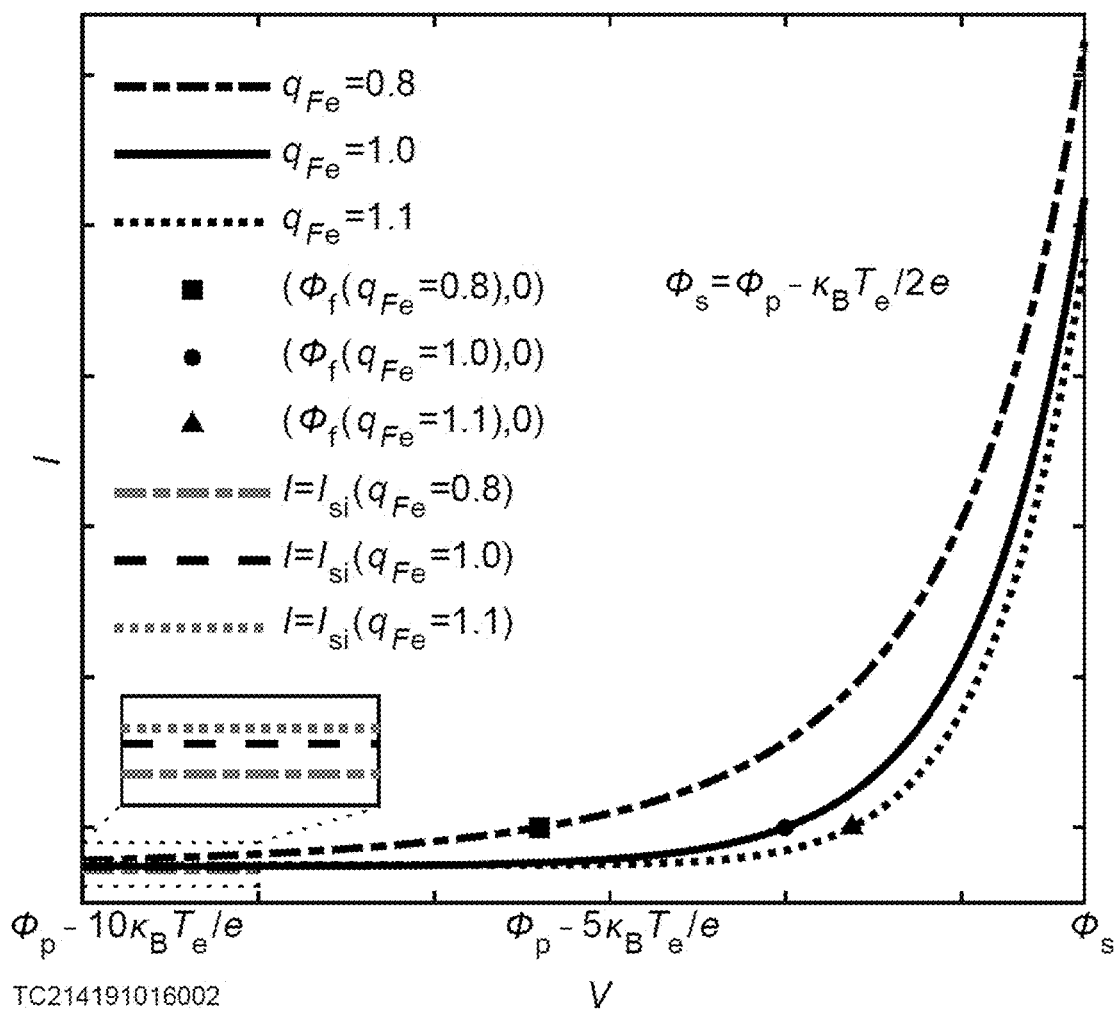
FIG. 3 is a characteristic curve of the nonextensive single electric probe.

As shown in FIG. 3, there are the I-V characteristic curves of a nonextensive single electric probe. The abscissa is external variable bias voltage V applied to single probe, the range chose here is $[\Phi_p - 10\kappa_B T_e/e, \Phi_s]$, where $\Phi_p$ is the plasma potential in the undisturbed region, and the reason why the $V > \Phi_p$ region is not selected is "the electron saturation flow obtained in specific experiments is often not saturated, and it is difficult to obtain plasma parameters from the saturated electron flow measurement value"; $\Phi_p - 10\kappa_B T_e/e \square \Phi_p$ belongs to ion saturation flow region; $\Phi_s$ is potential at ion sheath edge. When the bias voltage applied to a single probe drops to $\Phi_s$, an ion sheath begins to form on the probe surface. In the probe bias voltage $V \leq \Phi_p - 5\kappa_B T_e/e$ range, most of the electrons are repelled by the probe surface electric field.

The ordinate is the current I collected by the probe (in our discussion, current being drawn by the probe is designated as positive) with range of $[I_{si}, I_s]$ in this work, where $I_s$ is the current collected by the probe when the variable bias voltage applied to the single probe is $\Phi_s$, $I_{si}$ is ion saturation current, which corresponds to the negative probe bias voltage with a large absolute value. When the current collected by probe I=0, the electron and ion charge fluxes flowing to the probe surface are equal, and the probe bias voltage is the floating potential $\Phi_f$ at this time. The three curves in the figure are nonextensive single electric probe I-V characteristic curves when the electron nonextensive parameter ($q_{Fe}$) are respectively 0.8, 1.0 and 1.1. Focusing on the common characteristics of the three curves first, the curve begins to increase monotonically as the probe bias voltage increases from a large negative value; furthermore, the speed of the monotonically increase is getting faster and faster, and there is a floating potential point ($\Phi_f$, 0) in the process of the probe bias voltage increase. Current collected by probe is the sum of electron current and ion current. In the process of increasing probe bias voltage, the inhibition degree of the electric field around the probe on the positive direction electron current decreases, while the inhibition degree of the ion current on the opposite direction increases gradually, resulting in the increase of the current density $j_p$ collected by the probe; Since the electron mass $m_e$ is much smaller than the ion mass $m_i$, the absolute value of the electron current at $\Phi_s$ is obviously greater than the absolute value of the saturated ion current $I_{si}$, and the absolute increase effect of the bias voltage on the electron current is more obvious than that on the ion current, so the increasing speed gets faster and faster; It is easy to conclude that there is a certain point in the process of increasing that the electron current is equal to the ion current, so that the current collected by probe I=0. For different nonextensive parameter, when the nonextensive parameter ($q_{Fe}$) is 1, all conclusions are returned to the results under the Boltzmann-Gibbs statistical framework, and there is no monotonicity in the whole.

Figure 4:
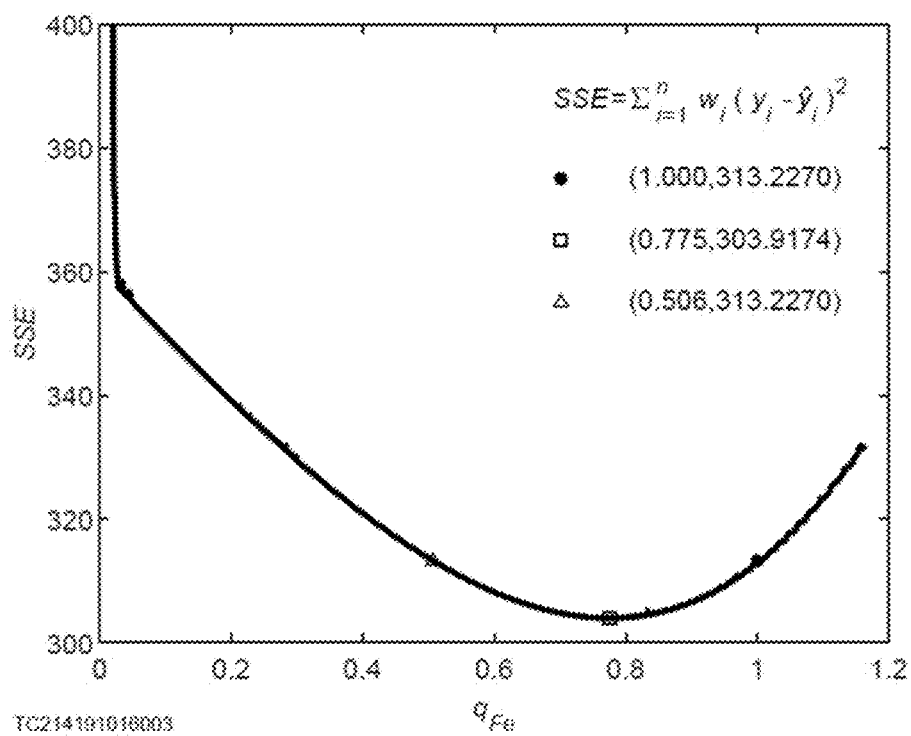
FIG. 4 shows a variation curve of SSE of nonlinear fitting with the electron nonextensive parameter when the value of the electron nonextensive parameter is accurate to 0.001; and the ordinate SSE is the sum of squares due to error.

As shown in FIG. 4, it is the variation curve of SSE with the electron nonextensive parameter $q_{Fe}$ when the electron nonextensive parameter is accurate to 0.001. SSE=$\Sigma_{i=1}^{n} \omega_i (y_i - \hat{y}_i)^2$, SSE is the sum of squares due to error, $\omega_i$ is the weight of the ith data point, $y_i$ is the y-coordinate of the ith data point, $\hat{y}_i$ represents the y-coordinate of the fitting line corresponding to the x-coordinate of the ith data point. The abscissa is the nonextensive parameter in the electron distribution function, and the value range is (−1, +∞), here takes $q_{Fe} \in [0, 1.164]$; The reason why $-1 < q_{Fe} < 0$ is not considered is that the total current factor is negative and the imaginary part of $\alpha_{q_{Fe}}$ appears when $q_{Fe} < 0$; the maximum of electron nonextensive parameter is $q_{Fe,max}$=Solution_of $\{V_{min} = \Phi_p - \kappa_B T_e/e(q_{Fe}-1)\}$, from where it can be seen that the electron nonextensive parameter range (maximum) that the nonextensive single electric probe can handle also depends on the minimum bias voltage value of the I-V experimental data, here $q_{Fe,max}$=1.164. $q_{Fe}$=1 is the extensive limit, and the results in this case all return to the results under the Boltzmann-Gibbs statistical framework. The ordinate, SSE, is the sum of the squares due to error, and its range is [303.9174, 4537.5306]a.u.; Note that SSE($q_{Fe}$=1)=313.2270 a.u., namely at the extensive limit, the nonlinear fitting SSE obtained by using the single probe theory based on nonextensive statistical mechanics is the same as the nonlinear fitting SSE obtained by using the traditional single probe theory, which proves the correctness of the nonextensive single electric probe theory proposed in the disclosure at the extensive limit. The curve of the nonlinear fitting SSE obtained by using the single probe theory based on nonextensive statistical mechanics with the change of electron nonextensive parameter decreases first and then increases on the whole, that is, the nonextensive fitting effect first becomes better and then becomes worse (there are fluctuations in very few places). Specifically, when $q_{Fe} \rightarrow 0$, the maximum SSE of nonlinear fitting can be obtained, SSE ($q_{Fe} \rightarrow 0$)=4537.5306 a.u.; when $q_{Fe} \in (0, 0.506)$, with the increase of electron nonextensive parameter, the SSE of nonlinear fitting becomes smaller and smaller (there are fluctuations in very few places) but is larger than the SSE of nonlinear fitting obtained by using the traditional single probe theory, until $q_{Fe}$=0.506 it is equal to the nonlinear fitting SSE=313.2270 a.u. obtained by using the traditional single probe theory; when $q_{Fe} \in (0.506, 0.775)$, the SSE of nonlinear fitting obtained by using the nonextensive single electric probe theory still decreases with the increase of the electron nonextensive parameter, until $q_{F_e}=0.775$ the SSE of nonlinear fitting reaches the minimum of 303.9174 a.u.; that is, the fitting result is closest to the real value at this time. After that, the SSE of nonlinear fitting increases with the increase of electron nonextensive parameter but is still smaller than the SSE of nonlinear fitting obtained by using the traditional single probe theory; until $q_{F_e}=1$, nonlinear fitting SSE is the same as that obtained by using the traditional single probe theory, because the nonextensive statistical mechanics is reduced to Boltzmann-Gibbs statistical mechanics, namely, the same theory is used at this time, and the 2 SSEs are naturally the same. When $q_{F_e} \in (1, 1.164)$, the SSE of nonlinear fitting obtained by using the nonextensive single electric probe theory is larger than that obtained by using the traditional single probe theory, and with the increase of the electron nonextensive parameter, the large degree gradually increases from zero until the maximum electron nonextensive parameter $q_{F_e,max}=1.164$; at this point, SSE ($q_{F_e}=1.164$)=332.0206 a.u. The mathematical reason for this trend is that the SSE of nonlinear fitting has been optimized once the electron nonextensive parameter $q_{F_e}$ increase from 0, and until $q_{F_e}=0.775$, the optimal value 303.9174 is obtained. After reaching the optimal value, the nonlinear fitting results have been getting worse with the increase of the nonextensive parameter. The physical reason for this change is that Boltzmann-Gibbs statistical mechanics is not an optimal statistical mechanics to describe the plasma system, but for the nonextensive statistical mechanics, because of its variable nonextensive parameter which can be adjusted, the theory can better describe the real plasma system. here, the real plasma system is described by the nonextensive statistical mechanics with an electron nonextensive parameter of 0.775.

Figure 5:
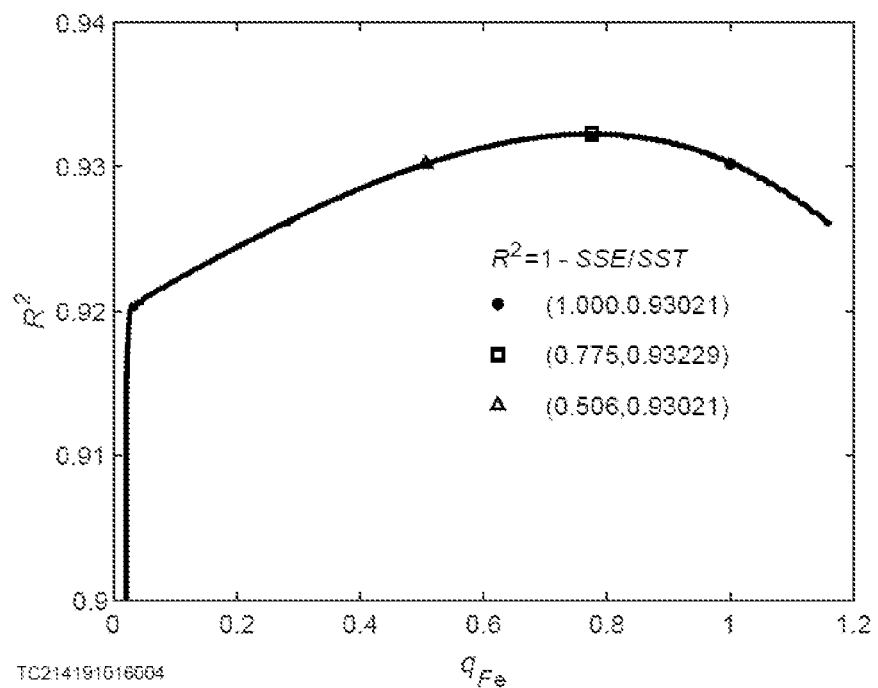
FIG. 5 shows a variation curve of $R^2$ of nonlinear fitting with electron nonextensive parameter when the value of the electron nonextensive parameter is accurate to 0.001; and the ordinate $R^2$ is the coefficient of determination.

As shown in FIG. 5, it is the variation curve of coefficient of determination ($R^2$) with electron nonextensive parameter $q_{Fe}$ when the value of the electron nonextensive parameter is accurate to 0.001, $R^2=1-SSE/SST$, SST is the sum of the squares of the difference between the experimental data and the mean, $SST=\Sigma_{i=1}^{n}\omega_i(y_i-\bar{y}_i)^2$. The ordinate is the nonlinear fitting coefficient of determination $R^2$ with range of [−0.2519, 0.93229] here. $q_{Fe}=1$ is the extensive limit, in which case $R^2(q_{Fe}=1)=0.93021$, that is, at the extensive limit, the nonlinear fitting determination coefficient obtained by the single probe theory based on nonextensive statistical mechanics is the same as the nonlinear fitting determination coefficient obtained by the traditional single probe theory, which proves the correctness of the nonextensive single electric probe theory that the disclosure proposed at the extensive limit. The curve of nonlinear fitting coefficient of determination obtained by the nonextensive single electric probe theory is increased first and then decreased with a monotonically increasing electron nonextensive parameter (fluctuations exist in very few places). Physically, in general, as electron nonextensive parameter increases from 0 to 0.775, the nonlinear fitting coefficient of determination is closer to 1, and then the fitting result is surely closer to reality. By contrast, as the electron nonextensive parameter increases further from 0.775, the farther the fitting result is from the real. Specifically, when $q_{F_e} \to 0$, the minimum value of nonlinear fitting coefficient of determination obtained by nonextensive single electric probe theory is $R^2(q_{F_e} \to 0)=-0.01098$; the nonlinear fitting coefficient of determination obtained by nonextensive single electric probe theory increases with the increase of the electron nonextensive parameter when $q_{F_e} \in (0, 0.506]$, but less than that obtained by traditional single probe theory, until $q_{F_e}=0.506$ the nonlinear fitting coefficient of determination obtained by nonextensive electric single probe theory will be equal to that obtained by traditional single probe theory. As the electron nonextensive parameter increases from 0.506, the nonlinear fitting coefficient of determination is monotonically increasing until $q_{F_e}=0.775$ (fluctuations exist in very few places) reaching the maximum coefficient of determination $R^2(q_{F_e}=0.775)=0.93229$; namely the nonlinear fitting coefficient of determination obtained by nonextensive single electric probe theory reaches the maximum value (closest to 1). In other words, it is the closest fitting result to the real; then, as the electron nonextensive parameter increases, the nonlinear fitting coefficient of determination decreases. The situation continues until $q_{F_e}=1$. The nonlinear fitting coefficient of determination obtained by nonextensive single electric probe theory is equal to that obtained by traditional single probe theory, because nonextensive statistical mechanics is reduced to Boltzmann-Gibbs statistical mechanics at this time; that is, nonlinear fitting coefficients of determination are obtained by the same theory, and the coefficients of determination are surely the same. When $q_{F_e} \in (1, 1.164)$, the nonlinear fitting coefficient of determination obtained by nonextensive single electric probe theory is less than that obtained by traditional single probe theory; furthermore, as the electron nonextensive parameter increases, the degree of smallness is gradually increased from zero. Finally, the nonlinear fitting coefficient of determination reaches $R^2(q_{F_e}=1.164)=0.926024$ at the edge of electron nonextensive parameter $q_{F_e}=1.164$. The reason for this change is that Boltzmann-Gibbs statistical mechanics is not the optimal statistical mechanics to describe plasma systems; by contrast, nonextensive statistical mechanics has the adjustable nonextensive parameters, so that the nonextensive statistical mechanics can better describe real plasma systems. The real plasma system here is described by a nonextensive statistical mechanics with an electron nonextensive parameter of 0.775, and this is the same result as the fitting method measured by SSE for goodness of fit, which has confirmed the reliability of our fitting results.

The results show that the results measured by the NSP fitting method are the closest to the I-V experimental data under the above two indexes, which proves the superiority of nonextensive statistical mechanics. It is worth mentioning that the nonextensivity of the system contained in I-V measurement data can be reflected by the optimal electron nonextensive parameter given by the NSP fitting method based on nonextensive statistical mechanics, which is the most important function of the nonextensive single electric probe proposed in the disclosure. The optimal electron nonextensive parameter value measured here is 0.775.

The following Table 1 shows all plasma parameters obtained by the method of the disclosure, which not only measures the nonextensivity of plasma, but also improves the diagnostic accuracy of other plasma parameters.

The above only expresses the preferred mode of implementation of the disclosure, which is described in detail, but cannot therefore be understood as a limitation on the scope of the disclosure. It should be pointed out that, for ordinary technicians in this field, a number of deformations, improvements and substitutions can be made on the premise of not breaking away from the idea of the disclosure, which belong to the protection scope of the disclosure. Therefore, the scope of protection of the disclosure shall be subject to the appended Claims.

TABLE 1

| Plasma parameters | ESP formula | ESP fitting | NSP fitting (the disclosure) |
|---|---|---|---|
| $q_{Fe}$ | — | — | 0.775 |
| $T_e$ (eV) | 7.0497 | 6.8843 | 2.8358 |
| $\Phi_p$ (V) | 23.6083 | 24.7228 | 19.4528 |
| $n_e(10^{15}cm^{-3})$ | 1.186 | 1.263 | 1.936 |
| $\Phi_f$ (V) | 0.070922 | 1.7377 | 2.0397 |
| $\alpha_{qFe}$ | — | 3.3388 | 6.1405 |
| SSE (a.u.) | 594.0110 | 313.2270 | 303.9174 |
| $R^2$ | 0.86765 | 0.93021 | 0.93229 |

What is claimed is:

1. A method for measuring an electron nonextensive parameter of a plasma, comprising:
   using nonextensive statistical mechanics and electric probe to measure the nonextensive parameter of the plasma comprises:
   step 1, describing the plasma with the nonextensive statistical mechanics to obtain a formula of I-V curve of the nonextensive single electric probe;
   step 2, adjusting a bias voltage V of a power supply connected with a single probe device and collecting I-V experimental data by the single probe device including a single probe and a probe circuit connected with the single probe: wherein the single probe passes through a vacuum chamber wall and directly contacts the plasma
   step 3, performing nonlinear fitting on the I-V experimental data collected in the step 2 by using the formula of I-V curve of the nonextensive single electric probe obtained in the step 1 to obtain a fitting curve, thereby obtaining a data set;
   step 4, drawing a SSE–$q_{F_e}$ curve using a sum of squares due to error (SSE) as a goodness of fit measure; wherein SSE=$\Sigma_{i=1}^{n}\omega_i(y_i-\hat{y}_i)^2$, $\omega_i$ is a weight of an ith data point, $y_i$ is a y-coordinate of the ith data point, $\hat{y}_i$ represents a y-coordinate of the fitting curve corresponding to an x-coordinate of the ith data point;
   step 5, obtaining a value of the electron nonextensive parameter corresponding to a minimum value of the SSE according to the SSE–$q_{F_e}$ curve;
   step 6, drawing a $R^2$–$q_{F_e}$ curve using a nonlinear fitting coefficient of determination $R^2$ as a goodness of fit measure;
   step 7, obtaining a value of the electron nonextensive parameter corresponding to a maximum value of the $R^2$ according to the $R^2$–$q_{F_e}$ curve; $R^2$=1−SSE/SST, SST is a sum of squares total of a difference between the experimental data and a mean, and SST=$\Sigma_{i=1}^{n}\omega_i(y_i-\overline{y}_i)^2$;
   step 8, comparing the values of the electron nonextensive parameter respectively corresponding to the minimum value of the SSE obtained in the step 5 and the maximum value of the $R^2$ obtained in the step 7;
   step 9, determining whether the values of the electron nonextensive parameter compared in the step 8 are consistent;
   step 10, confirming any one of the values of the electron nonextensive parameter as an optimal value of the electron nonextensive parameter when the values of the electron nonextensive parameter are determined to be consistent;
   step 11, substituting the optimal value of the electron nonextensive parameter obtained in the step 10 into the data set in the step 3 to obtain a target data set corresponding to the optimal value of the electron nonextensive parameter; and
   step 12, outputting a measurement result report.

2. The method according to claim 1, wherein a formula of collection current of the nonextensive single electric probe in the step 1 is:

$$I = en_e A_p \left(\frac{\kappa_B T_e}{m_i}\right)^{1/2} \left[\frac{A_q}{q_{F_e}}\sqrt{\frac{m_i}{2\pi m_e}}\left[1+(q_{F_e}-1)\frac{e(V-\Phi_p)}{\kappa_B T_e}\right]^{\frac{1}{q_{F_e}-1}+\frac{1}{2}} - \left[1-(q_{F_e}-1)\frac{1}{2}\right]^{\frac{1}{q_{F_e}-1}+\frac{1}{2}}\right]$$

where V is the bias voltage, $\Phi_p$ is a plasma potential, $\kappa_B$ is the Boltzmann constant, e is the electron charge, $T_e$ is an electron temperature, $n_e$ is an electron density in an undisturbed area, $A_p$ is a probe area, $A_q$ is the normalization constant of nonextensive distribution, $q_{F_e}$ is the electron nonextensive parameter, $m_i$ is an ion mass, and $m_e$ is the electron mass.

3. A method for measuring an electron nonextensive parameter of a plasma, comprising:
   step 1, describing the plasma with nonextensive statistical mechanics to obtain a formula of I-V curve of a nonextensive single electric probe;
   step 2, adjusting a bias voltage V of a power supply connected with a single probe device and collecting I-V experimental data by the single probe device including a single probe and a probe circuit connected with the single probe; wherein the single probe passes through a vacuum chamber wall and directly contacts the plasma;
   step 3, performing nonlinear fitting on the I-V experimental data collected in the step 2 by using the formula of I-V curve of the nonextensive single electric probe obtained in the step 1 to obtain a fitting curve, thereby obtaining a data set;
   step 4, drawing a SSE–$q_{F_e}$ curve using a sum of squares due to error (SSE) as a goodness of fit measure; wherein SSE=$\Sigma_{i=1}^{n}\omega_i(y_i-\hat{y}_i)^2$, $\omega_i$ is a weight of an ith data point, $y_i$ is a y-coordinate of the ith data point, $\hat{y}_i$ represents a y-coordinate of the fitting curve corresponding to an x-coordinate of the ith data point;
   step 5, obtaining a value of the electron nonextensive parameter corresponding to a minimum value of the SSE according to the SSE–$q_{F_e}$ curve;
   step 6, drawing a $R^2$–$q_{F_e}$ curve using a nonlinear fitting coefficient of determination $R^2$ as a goodness of fit measure;
   step 7, obtaining a value of the electron nonextensive parameter corresponding to a maximum value of the $R^2$ according to the $R^2$–$q_{F_e}$ curve; wherein $R^2$=1−SSE/SST, SST is a sum of squares total of a difference between the experimental data and a mean, and SST=$\Sigma_{i=1}^{n}\omega_i(y_i-\overline{y}_i)^2$;
   step 8, comparing the values of the electron nonextensive parameter respectively corresponding to the minimum value of the SSE obtained in the step 5 and the maximum value of the $R^2$ obtained in the step 7;
   step 9, determining whether the values of the electron nonextensive parameter compared in the step 8 are consistent;
   step 10, confirming any one of the values of the electron nonextensive parameter as an optimal value of the electron nonextensive parameter when the values of the electron nonextensive parameter are determined to be consistent;

step 11, substituting the optimal value of the electron nonextensive parameter obtained in the step 10 into the data set in the step 3 to obtain a target data set corresponding to the optimal value of the electron nonextensive parameter; and step 12, outputting a measurement result report, wherein the measurement result report is for presenting the electron nonextensive parameter of the plasma.

4. The method according to claim 3, wherein a formula of collection current of the nonextensive single electric probe in the step 1 is:

$$I = e n_e A_p \left(\frac{\kappa_B T_e}{m_1}\right)^{1/2} \left[\frac{A_q}{q_{F_e}} \sqrt{\frac{m_i}{2\pi m_e}} \left[1 + (q_{F_e} - 1)\frac{e(V - \Phi_p)}{\kappa_B T_e}\right]^{\frac{1}{q_{F_e}-1}+\frac{1}{2}} - \left[1 - (q_{F_e} - 1)\frac{1}{2}\right]^{\frac{1}{q_{F_e}-1}+\frac{1}{2}}\right]$$

where V is the bias voltage, $\Phi_p$ is a plasma potential, $\kappa_B$ is the Boltzmann constant, e is the electron charge, $T_e$ is an electron temperature, $n_e$ is an electron density in an undisturbed area, $A_p$ is a probe area, $A_q$ is the normalization constant of nonextensive distribution, $q_{F_e}$ is the electron nonextensive parameter, $m_i$ is an ion mass, and $m_e$ is the electron mass.

* * * * *